US011821928B2

(12) United States Patent
Lin et al.

(10) Patent No.: US 11,821,928 B2
(45) Date of Patent: Nov. 21, 2023

(54) CHARGING APPARATUS AND CHARGING METHOD OF OPERATING THE SAME

(71) Applicant: DELTA ELECTRONICS, INC., Taoyuan (TW)

(72) Inventors: Bo-Song Lin, Taoyuan (TW); Yu-Ming Hsu, Taoyuan (TW)

(73) Assignee: DELTA ELECTRONICS INC., Taoyuan (TW)

( * ) Notice: Subject to any disclaimer, the term of this patent is extended or adjusted under 35 U.S.C. 154(b) by 14 days.

(21) Appl. No.: 17/808,298

(22) Filed: Jun. 22, 2022

(65) Prior Publication Data

US 2023/0236227 A1 Jul. 27, 2023

(30) Foreign Application Priority Data

Jan. 26, 2022 (CN) .......................... 202210093247.7

(51) Int. Cl.
*H02J 7/00* (2006.01)
*G01R 19/175* (2006.01)

(52) U.S. Cl.
CPC .......... *G01R 19/175* (2013.01); *H02J 7/0047* (2013.01)

(58) Field of Classification Search
CPC ............................ G01R 19/175; H02J 7/0047
USPC ....................................................... 327/110
See application file for complete search history.

(56) References Cited

U.S. PATENT DOCUMENTS

| 10,427,529 | B2* | 10/2019 | Huang | ................... B60L 50/51 |
| 2017/0057369 | A1* | 3/2017 | Næsje | ..................... B60L 53/66 |
| 2017/0237377 | A1* | 8/2017 | Furukawa | ............. H02P 29/028 318/564 |
| 2019/0210481 | A1* | 7/2019 | Ishida | ..................... B60L 53/62 |
| 2022/0379873 | A1* | 12/2022 | Shui | ........................ B60K 6/52 |
| 2023/0236227 | A1* | 7/2023 | Lin | ...................... G01R 19/175 327/79 |

* cited by examiner

*Primary Examiner* — Ryan Jager
(74) *Attorney, Agent, or Firm* — MUNCY, GEISSLER, OLDS & LOWE, P.C.

(57) ABSTRACT

A charging apparatus includes a first terminal, a second terminal, a switch unit, a control unit, and a communication unit. The switch unit is turned on or turned off to control whether the first terminal is coupled to the second terminal. The control unit sets a first time from the switch unit receiving a control signal to the switch unit actually being turned on or turned off. The control unit and the electric vehicle mutually transmit a communication signal through the communication unit. The control unit calculates a second time when the current reaches to a zero point based on an abnormal state indicated by the communication signal, and calculates a third time when the switch unit operates at the zero point based on the first time and the second time, and provides the control signal to turn off the switch unit at the third time.

16 Claims, 8 Drawing Sheets

CHARGING APPARATUS AND CHARGING METHOD OF OPERATING THE SAME

BACKGROUND

Technical Field

The present disclosure relates to a charging apparatus and a charging method of operating the same, and more particularly to a charging apparatus with zero-current switching function and a charging method of operating the same.

Description of Related Art

The statements in this section merely provide background information related to the present disclosure and do not necessarily constitute prior art.

Due to the raising of environmental awareness, more and more users have abandoned the traditional fuel-based vehicles and switched to rechargeable electric vehicles. Since the application of electric vehicles is becoming more and more popular, the demand for charging stations is also increasing. Usually, the charging station is provided with at least one charging apparatus (commonly known as a charging pile) to provide users with charging requirements to charge their own electric vehicles. When the electric vehicle wants to be charged, it will be confirmed first that the electric vehicle is connected to the charging apparatus, and then the internal relay of the charging apparatus will turn on so as to avoid the risk of power leakage when it is not charging.

Figure 1A:
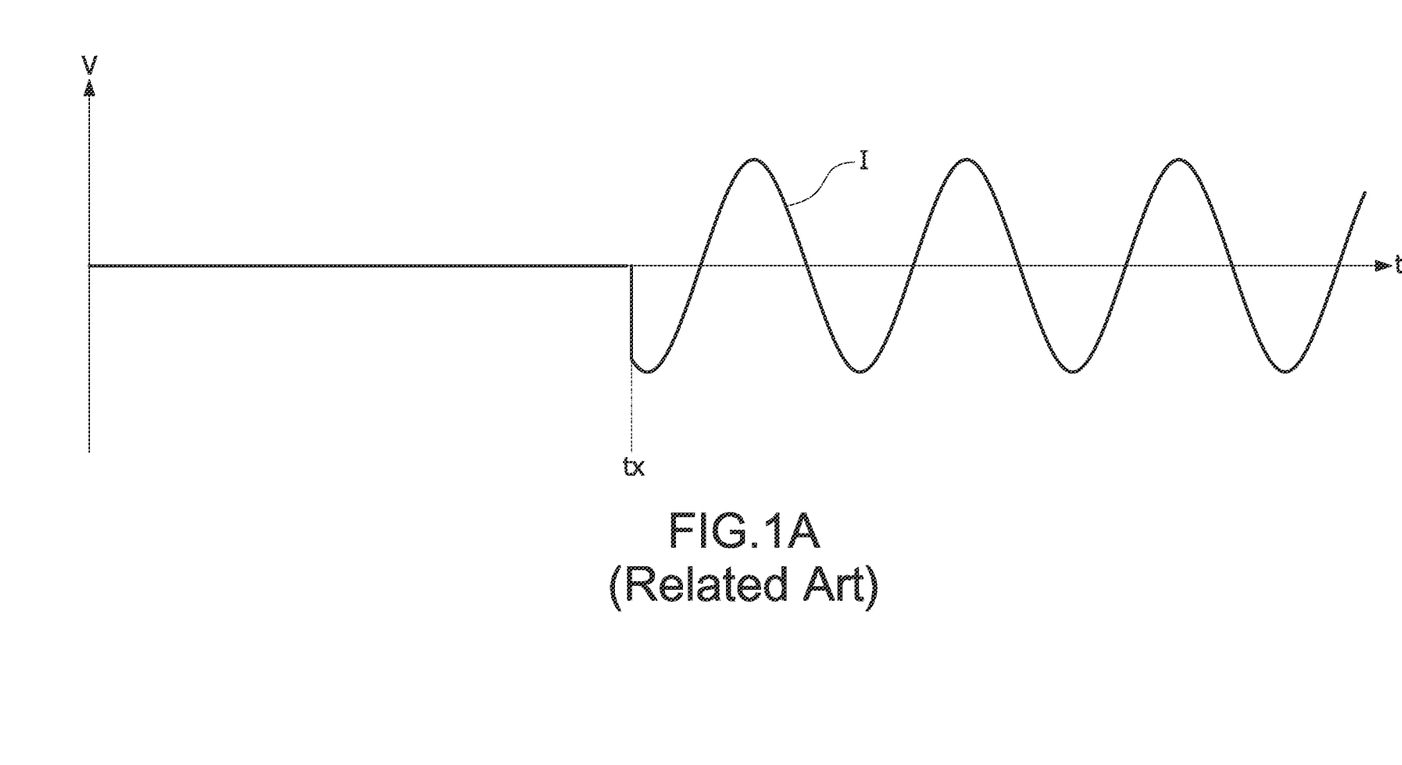
FIG. 1A is a schematic waveform diagram of the conventional relay operating at a turned-on point.
Figure 1B:
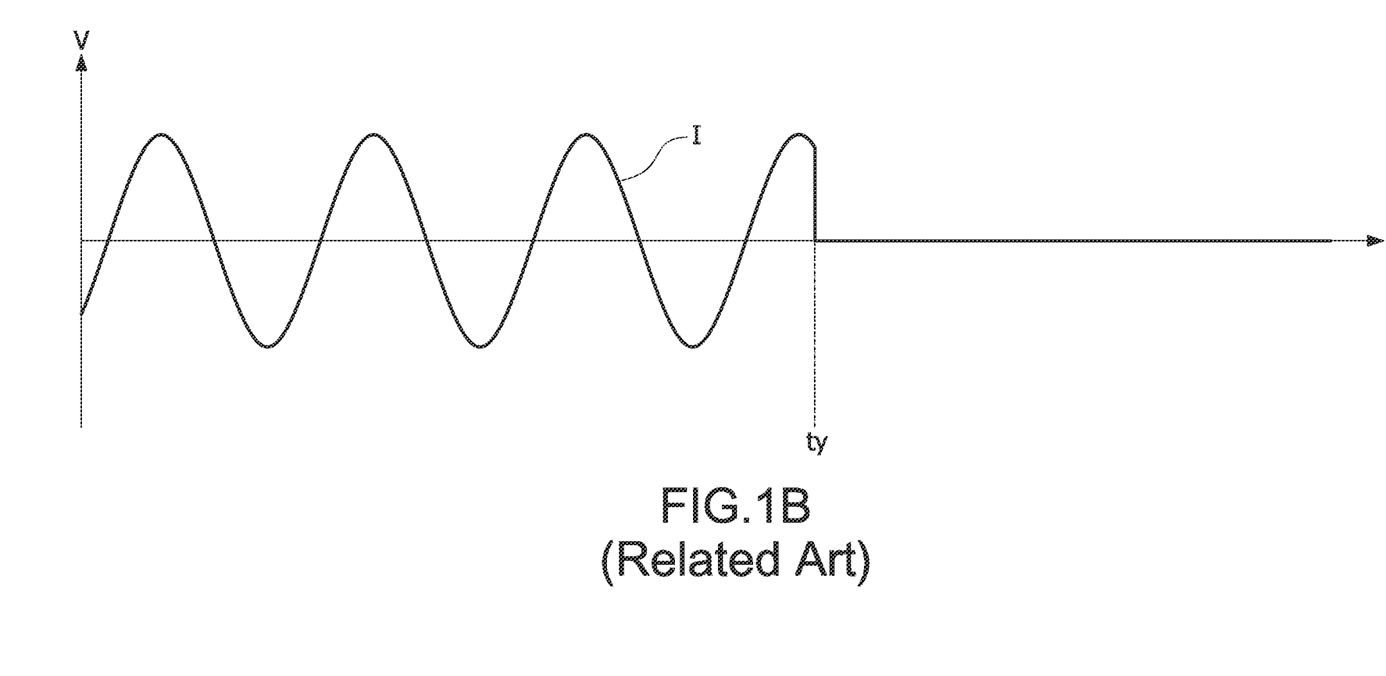
FIG. 1B is a schematic waveform diagram of the conventional relay operating at a turned-off point.

However, as shown in FIG. 1A and FIG. 1B, currently in the application of the charging apparatus, the control optimization is not specially performed at the time points of the connection and switching of the relays inside the charging apparatus, and therefore there is a chance that the relay could be switched at the phase angle of the maximum current I. Since the relay has a coil inside, which is an inductive load, and if there is a current I when the relay is switched (i.e., at time tx and time ty), the inductance resists the change of the current I, which will cause the relay to generate a back electromotive force (back EMF). Therefore, when the relay is connected, sparks will be generated, and the heat caused by the sparks will easily cause contacts of the relay to stick.

Accordingly, the present disclosure provides a charging apparatus and a method of operating the charging apparatus to prolong the life of the switch unit and prevent the occurrence of dangerous events caused by sparks.

SUMMARY

In order to solve the above-mentioned problems, the present disclosure provides a charging apparatus to charge an electric vehicle. The charging apparatus includes a first terminal, a second terminal, a switch unit, a control unit, and a communication unit. The first terminal receives a power source. The second terminal is coupled to the electric vehicle. The switch unit is coupled to the first terminal and the second terminal, and is turned on or turned off to control whether the first terminal is coupled to the second terminal. The control unit is coupled to the switch unit, and sets a first time from the switch unit receiving a control signal to the switch unit actually being turned on or turned off. The communication unit is coupled to the control unit and the second terminal, and the control unit and the electric vehicle mutually transmit a communication signal through the communication unit. The control unit detects a phase of a current of the power source, indicates an abnormal state based on the communication signal, and calculates a second time when the current reaches to a zero point based on the phase. The control unit calculates a third time when the switch unit operates at the zero point based on the first time and the second time, and provides the control signal to turn off the switch unit at the third time.

In order to solve the above-mentioned problems, the present disclosure provides a method of operating a charging apparatus. The charging apparatus provides a power source to charge an electric vehicle. The charging apparatus includes a switch unit and a communication unit. The switch unit is turned on or turned off to control whether the power source is coupled to the electric vehicle. The method includes steps of: setting a first time from when the switch unit receiving a control signal to when the switch unit actually being turned on or turned off, and detecting a phase of a current of the power source; mutually transmitting a communication signal with the electric vehicle through the communication unit, and confirming whether the communication signal indicates an abnormal state; calculating a second time when the current reaches to a zero point through the phase based on the abnormal state; calculating a third time when the switch unit operates at the zero point based on the first time and the second time, and providing the control signal to turn off the switch unit at the third time.

The main purpose and effect of the present disclosure is that no matter the electric vehicle needs to be charged/fed or one of the electric vehicle and the charging apparatus is in an abnormal state, the control unit will control the switch unit to act/operate when the current of the power source is as close to zero as possible, thereby being less prone to sparking or sticking, and prolonging switch unit's life and preventing sparks from causing dangerous events due to the low current when the switch unit is actuated.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Reference will now be made to the drawing figures to describe the present disclosure in detail. It will be understood that the drawing figures and exemplified embodiments of present disclosure are not limited to the details thereof.

Figure 2:
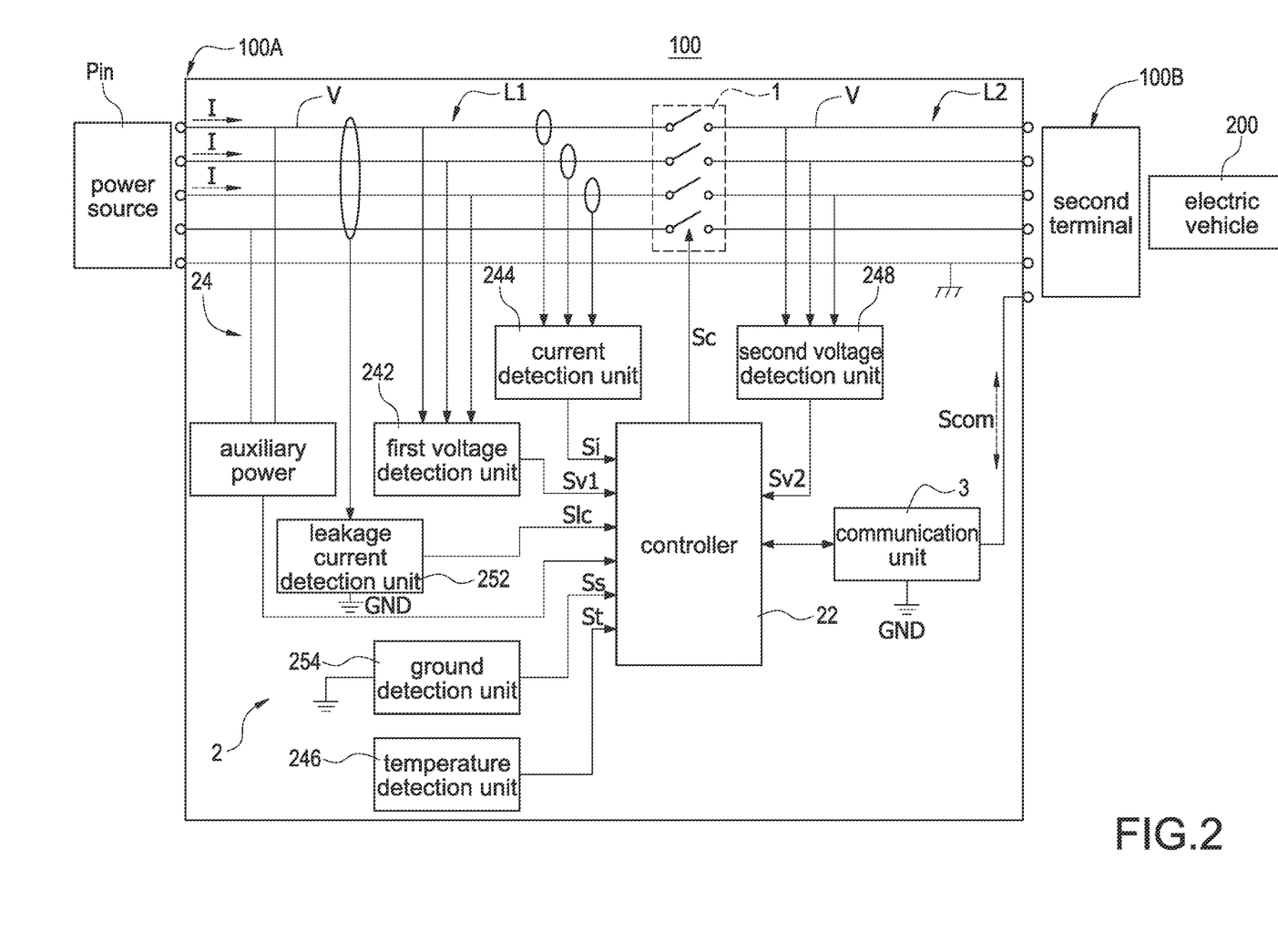
FIG. 2 is a block circuit diagram of a charging apparatus with zero-current switching function according to the present disclosure.

Please refer to FIG. 2, which shows a block circuit diagram of a charging apparatus with zero-current switching function according to the present disclosure. The charging apparatus 100 receives a power source Pin and provides the power source Pin to an electric vehicle 200, for example, but not limited to, a chargeable vehicle to charge the electric vehicle 200. The charging apparatus 100 includes a first terminal 100A and a second terminal 100B. The first terminal 100A receives the power source Pin and the second terminal 100B is coupled to the electric vehicle 200. In one embodiment, the second terminal 100B may be a charging gun of the charging apparatus 100 for connecting to the electric vehicle 200. The charging apparatus 100 further includes a switch unit 1, a control unit 2, and a communication unit 3. A first end of the switch unit 1 is coupled to the first terminal 100A, and a second end of the switch unit 1 is coupled to the second terminal 100B. The switch unit 1 is controlled to be turned on or turned off so as to determine whether that the first terminal 100A is connected to or disconnected from the second terminal 100B, that is, a path between the power source Pin and the electric vehicle 200 is connected or disconnected. When the switch unit 1 is turned on, the power source Pin is provided to charge the electric vehicle 200 through the switch unit 1, otherwise, the electric vehicle 200 fails to be charged. In one embodiment, the switch unit 1 may be a relay, and the charging apparatus 100 may be a bidirectional charging apparatus. Not only the charging apparatus 100 can provide the power source Pin to charge the electric vehicle 200, but also the electric vehicle 200 can feed electricity to the charging apparatus 100.

The control unit 2 is coupled to the switch unit 1 and provides a control signal Sc to control turning on or turning off the switch unit 1. The communication unit 3 is coupled to the control unit 2 and the second terminal 100B. The control unit 2 and the electric vehicle 200 mutually transmit a communication signal Scom through the communication unit 3 so that the control unit 2 communicates with the electric vehicle 200. In one embodiment, the communication unit 3 may be a control pilot circuit. The control unit 2 communicates with the electric vehicle 200 through a handshaking protocol mainly by a control guide circuit so as to realize the states and requirements of each other. The main purpose and effect of the present disclosure is that no matter the electric vehicle 200 needs to be charged/fed or one of the electric vehicle 200 and the charging apparatus 100 is in an abnormal state, the control unit 2 will control the switch unit to act/operate when the current I of the power source Pin is as close to zero as possible, thereby being less prone to sparking or sticking, and prolonging switch unit's life and preventing sparks from causing dangerous events due to the low current when the switch unit 1 is actuated.

Specifically, the control unit 2 sets a mechanical delay time of the switch unit 1 (hereinafter referred to as a first time), that is, the time from when the switch unit 1 receives the control signal Sc to when the switch unit 1 actually operates/acts to turn on or turn off. In particular, the first time may be preset based on the model of the switch unit 1 before the charging apparatus 100 leaves the factory, or the first time may be set by user after the charging apparatus 100 leaves the factory. Afterward, when the charging apparatus 100 is running (including the electric vehicle 200 has not been connected and in the standby state, or the electric vehicle 200 has been connected to the second terminal 100B), the control unit 2 detects the phase of the current I of the power source Pin to realize the time when the current I reaches to a zero point. When the charging apparatus 100 or the electric vehicle 200 is in an abnormal state, it will notify the abnormal state to the other party through the communication signal Scom. Therefore, when the control unit 2 indicates the abnormal state based on the communication signal Scom, it calculates the time (hereinafter referred to as the second time) through the phase when the current I reaches to the nearest zero point from the present current.

Afterward, the control unit 2 calculates the time when the switch unit 1 operates at the zero point (hereinafter referred to as the third time) based on the first time and the second time. The third time is mainly the time when the control unit 2 realizes the second time when the current I reaches to the zero point, and then provides the control signal Sc in advance of the first time. Therefore, the control unit 2 provides the control signal Sc to the switch unit 1 at the third time so that after the switch unit 1 receives the control signal Sc and passes through the mechanical delay, the switch unit 1 operates at the second time, and therefore when the current I is close to the zero point, the switch unit 1 can operate (i.e., turn off in response to the abnormal state). In particular, what kind of abnormal state occurs will be further explained later.

Similarly, when neither the charging apparatus 100 nor the electric vehicle 200 is in the abnormal state, the communication signal Scom indicates the normal state or when the communication signal Scom indicates the electric vehicle 200 completed charging, the control unit 2 will also control the switch unit 1 operates at the second time. Specifically, after the electric vehicle 200 is coupled to the second terminal 100B of the charging apparatus 100 and the communication signal Scom indicates the normal state, the power source Pin can start to charge the electric vehicle 200. Therefore, the control unit 2 calculates the second time when the current I reaches to the nearest zero point from the present current, and calculates the third time based on the first time and the second time so as to provide the control signal Sc at the third time to control the switch unit 1 so that the switch unit 1 is turned on when the switch unit 1 is close to the zero point. On the other hand, the same is true when the control unit 2 indicates the electric vehicle 200 to complete the charging based on the communication signal Scom so that the switch unit 1 is turned off when the switch unit 1 is close to the zero point, and the detail description is omitted here for conciseness.

Please refer to FIG. 2 again, the control unit 2 includes a controller 22 and a detection unit 24, and the controller 22 may be a microcontroller unit (MCU). The controller 22 is coupled to the switch unit 1 and the communication unit 3, and the detection unit 24 is coupled to the controller 22. The controller 22 detects whether the charging apparatus 100 is in an abnormal state through the detection unit 24, and communicates with the electric vehicle 200 by controlling the communication unit 3 to realize the status and requirements of each other. The controller 22 may also set the first time to provide the control signal Sc at an appropriate time (i.e., at the third time) to control the switch unit 1 to operate based on the current overall conditions of the power source Pin, the charging apparatus 100, and the electric vehicle 200.

Furthermore, the detection unit 24 includes a first voltage detection unit 242, a current detection unit 244, a temperature detection unit 246, a second voltage detection unit 248, a leakage current detection unit 252, and a ground detection unit 254. The first voltage detection unit 242 is coupled to a first path L1 between the first terminal 100A and the switch unit 1, and detects a voltage V of the power source Pin on the first path L1 to provide a first voltage signal Sv1 to the controller 22. The controller 22 realizes the magnitude of the voltage V on the first path L1 based on the first voltage signal Sv1, and determines whether an abnormal state of under voltage or over voltage occurs. The current detection unit 244 is coupled to the first path L1, and detects a current I to provide a current signal Si to the controller 22. The controller 22 realizes the magnitude of the current I on the first path L1 based on the current signal Si, and determines whether an abnormal state of over current occurs. The temperature detection unit 246 detects a temperature of the charging apparatus 100 and provides a temperature signal St to the controller 22. The controller 22 realizes the level of the temperature based on the temperature signal St, and determines whether an abnormal state of over temperature occurs. In particular, the temperature detection unit 246 may usually be configured/arranged/installed in important components, for example, but not limited to the controller 22 that are prone to heat, so as to monitor whether the components such as the controller 22 are overheated.

The leakage current detection unit 252 is coupled to the first path L1 between the first terminal 100A and the switch unit 1, and detects the current I to provide a leakage current signal S1c to the controller 22 so that the controller 22 realizes whether an abnormal state of leakage current occurs based on the leakage current signal S1c. In one embodiment, the leakage current detection unit 252 may be a residual current device (RCD), but is not limited thereto. The ground detection unit 254 is coupled to a ground end GND of the charging apparatus 100, and detects the ground end GND to provide a detection Ss to the controller 22 so that the controller 22 realizes whether the abnormal state of the ground fault occurs based on the detection signal Ss. When the controller 22 receives the signal provided by the detection unit 24 and determines that the charging apparatus 100 is in an abnormal state of any one of under voltage, over voltage, over current, over temperature, leakage current, and ground fault, the controller 22 communicates with the electric vehicle 200 by providing a communication signal Scom with a positive voltage level through the communication unit 3 so that the electric vehicle 200 performs corresponding operations/actions.

The second voltage detection unit 248 is coupled to a second path L2 between the switch unit 1 and the second terminal 100B, and detects a voltage V of the power source Pin on the second path L2 to provide a second voltage signal Sv2 to the controller 22. The controller 22 realizes the magnitude of the voltage V on the second path L2 based on the second voltage signal Sv2, and determines whether the switch unit 1 has an abnormality of switch contact sticking or switch driving failure based on the first voltage signal Sv1 and the second voltage signal Sv2. The controller 22 can acquire the voltage V on the front and rear paths of the switch unit 1 mainly through the first voltage signal Sv1 and the second voltage signal Sv2 so as to confirm whether the present operation of the switch unit 1 is consistent with the control signal Sc. When the controller 22 receives the first voltage signal Sv1 and the second voltage signal Sv2 to determine that the switch unit 1 is in an abnormal state of either switch contact sticking or switch drive failure, the controller 22 provides the communication signal Scom with a negative voltage level through the communication unit 3 to notify the electric vehicle 200 so as to make the electric vehicle 200 operate correspondingly. On the other hand, when an abnormal state occurs at the end of the electric vehicle 200 (for example, but not limited to, the over voltage, the overcurrent, etc.), the electric vehicle 200 adjusts the communication signal Scom to zero voltage level to notify the charging apparatus 100 that an abnormal state occurs at the end of the electric vehicle 200 through the communication unit 3.

Figure 3:
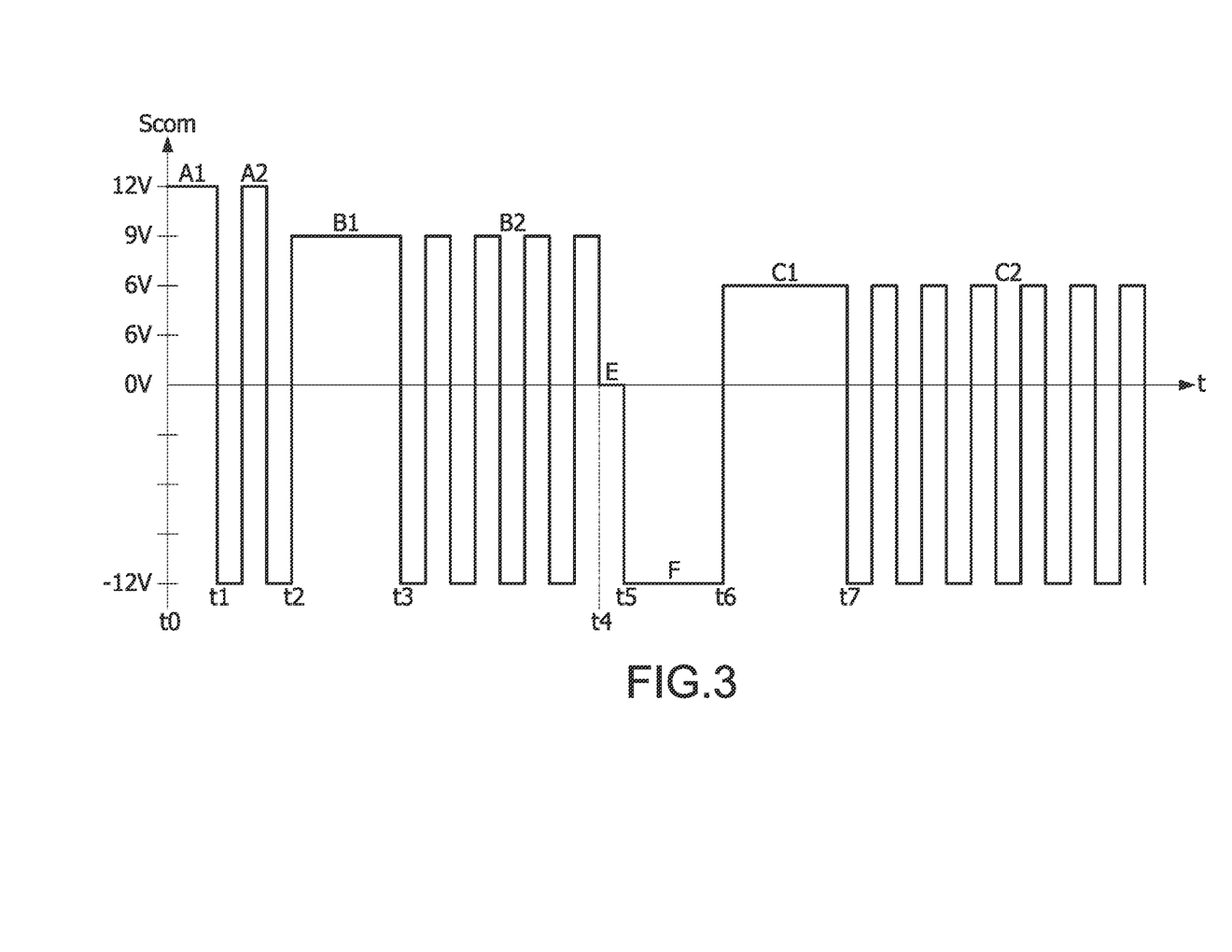
FIG. 3 is a schematic waveform diagram of the communication signal of the charging apparatus in different stages according to the present disclosure.

Please refer to FIG. 3, which shows a schematic waveform diagram of the communication signal of the charging apparatus in different stages according to the present disclosure, and also refer to FIG. 2. In FIG. 3, the time axis coordinate is only for the convenience of describing the waveforms of each stage of the communication signal Scom, not shows the complete charging process. When the time is from t0 to time t1, the charging apparatus 100 is in the standby state after being turned on (activated), and the charging apparatus 100 provides the communication signal Scom with a first positive voltage level A1 to the second terminal 100B through the communication unit 3 to detect whether there is an electric vehicle 200 connected to the second terminal 100B. In one embodiment, the first positive voltage level A1 may be a DC voltage of 12 volts. When the time is from time t1 to time t2, after the electric vehicle 200 is pulled away (disconnected), the charging apparatus 100 confirms that the electric vehicle 200 is pulled away, and the charging apparatus 100 provides a PWM signal A2 (i.e., the communication signal Scom) corresponding to the first positive voltage level A1 to the second terminal 100B through the communication unit 3. After confirming that the electric vehicle 200 has been pulled away, the charging apparatus 100 adjusts the communication signal Scom back to the first positive voltage level A1 to return to the standby state. In one embodiment, the PWM signal A2 may be a pulse signal of 12 volts and 1 kHz. When the time is from time t2 to time t3, the physical connection between the charging apparatus 100 and the electric vehicle 200 is completed (that is, the charging gun has been inserted into the electric vehicle 200). The charging apparatus 100 provides the communication signal Scom of a second positive voltage level B1 to the second terminal 100B through the communication unit 3 to notify the electric vehicle 200 that the communication mechanism of the handshaking agreement is ready to be established. In one embodiment, the second positive voltage level B1 may be a DC voltage of 9 volts. When the time is from time t3 to time t4, the communication mechanism between the charging apparatus 100 and the electric vehicle 200 has been established, and the charging apparatus 100 provides a first PWM signal B2 in response to the second positive voltage level B1 to the second terminal 100B through the communication unit 3 so as to realize the status and requirements of each other. In one embodiment, the first PWM signal B2 may be a pulse signal of 9 volts and 1 kHz.

When the time is from time t4 to time t5, an abnormal state occurs at the end of the electric vehicle 200. The electric vehicle 200 adjusts the communication signal Scom to a zero voltage level E so as to notify the charging apparatus 100 that an abnormal state occurs at the end of the electric vehicle 200 through the communication unit 3. In one embodiment, the zero voltage level E may be a DC voltage of 0 volt. When the time is from time t5 to time t6, the charging device 100 realizes that the switch unit 1 is in an abnormal state of switch contact sticking or switch drive failure. The controller 22 notifies the electric vehicle 200 by providing the communication signal Scom of a negative voltage level F through the communication unit 3 so that the electric vehicle 200 performs corresponding operations/actions. In one embodiment, the negative voltage level F may be a DC voltage of −12 volts. When the time is from time t6 to time t7, the charging apparatus 100 determines the abnormal state of any one of under voltage, over voltage, over current, over temperature, leakage current, and ground fault by receiving the signal provided by the detection unit 24. The charging apparatus 100 notifies the electric vehicle 200 by providing the communication signal Scom of a third positive voltage level C1 through the communication unit 3 so that the electric vehicle 200 performs corresponding operations/actions. In one embodiment, the third positive voltage level C1 may be a DC voltage of 6 volts.

After time t7, the power source Pin may be provided to the electric vehicle 200 by the charging apparatus 100, and the electric vehicle 200 waits to receive the power source Pin. When the time is from t7 to time t8, the power source Pin is provided to the electric vehicle 200 by the charging apparatus 100. The charging device 100 provides a second PWM signal C2 to the second terminal 100B in response to the third positive voltage level C1 through the communication unit 3. During the charging process, when neither the charging apparatus 100 nor the electric vehicle 200 is in an abnormal state, the communication signal Scom is maintained at the first PWM signal B2. In one embodiment, the second PWM signal C2 may be a pulse signal of 6 volts and 1 kHz. In one embodiment, the voltage level and the frequency of the PWM signal described in the drawings are only for illustration. The voltage level and frequency may vary according to different models of the charging apparatus 100 and the brand of the electric vehicle 200, and therefore it is not limited to the above-mentioned exemplified values.

Figure 4A:
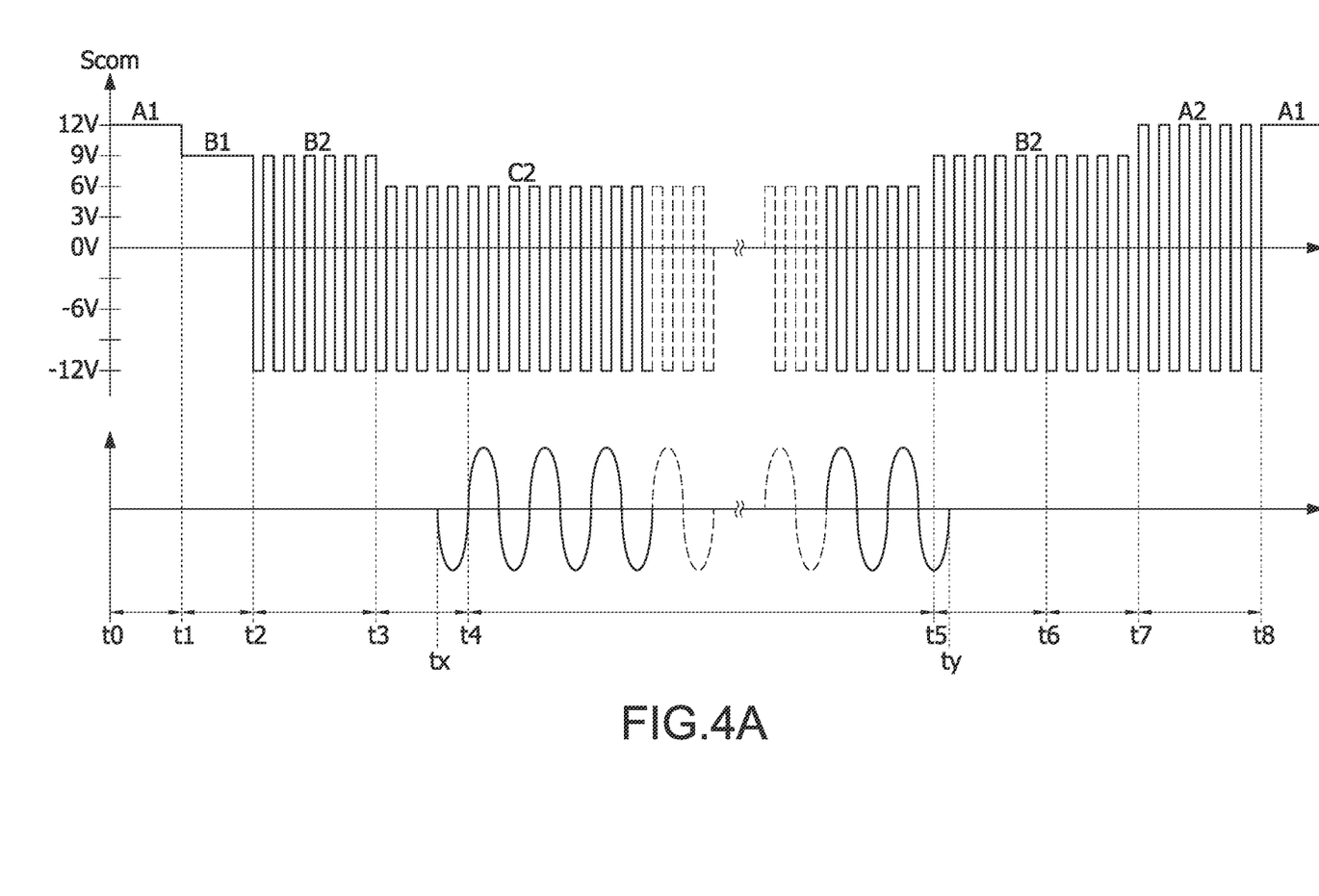
FIG. 4A is a schematic waveform diagram of the communication signal of the charging apparatus under a normal charging state according to a first embodiment of the present disclosure.
Figure 4B:
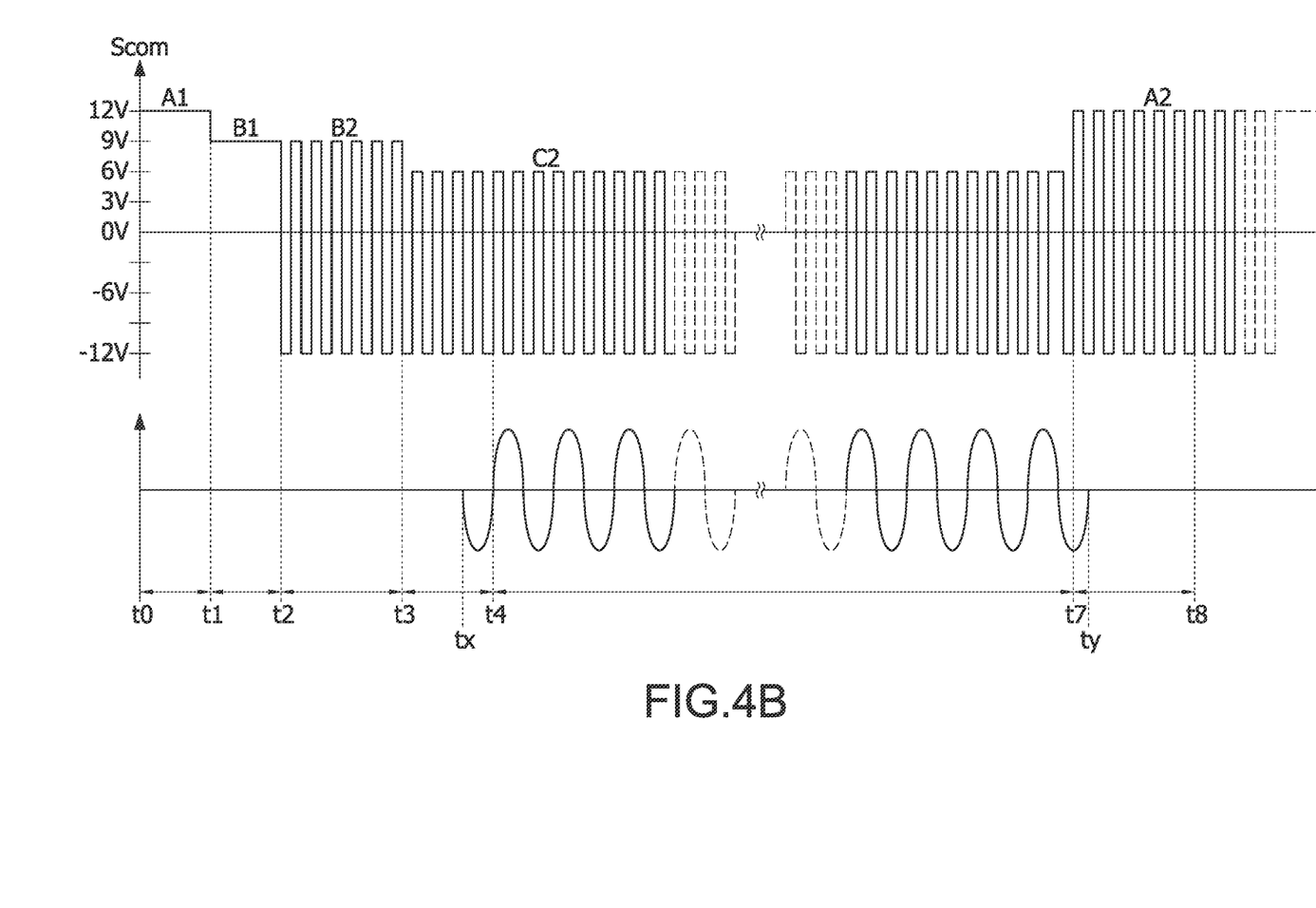
FIG. 4B is a schematic waveform diagram of the communication signal of the charging apparatus under the normal charging state according to a second embodiment of the present disclosure.

Please refer to FIG. 4A, which shows a schematic waveform diagram of the communication signal of the charging apparatus under a normal charging state according to a first embodiment of the present disclosure, and please refer to FIG. 4B, which shows a schematic waveform diagram of the communication signal of the charging apparatus under the normal charging state according to a second embodiment of the present disclosure, and also refer to FIG. 2 to FIG. 3. In FIG. 4A, the electric vehicle 200 notifies the charging apparatus 100 that the charging has been completed through the communication unit 3. When the time is from time t0 to time t1, the charging apparatus 100 is in a standby state and provides the communication signal Scom of the first positive voltage level A1 to the second terminal 100B. When the electric vehicle 200 is connected and the physical connection between the charging apparatus 100 and the electric vehicle 200 is completed (i.e., at time t1), the charging apparatus 100 starts to provide the communication signal Scom of the second positive voltage level B1 to the second terminal 100B. After the communication mechanism has been established (i.e., at time t2), the charging apparatus 100 provides the first PWM signal B2 to the second terminal 100B to communicate with the electric vehicle 200 to realize the status and requirements of each other.

After the charging apparatus 100 and the electric vehicle 200 communicate with each other (i.e., at time t3), the charging apparatus 100 starts to charge the electric vehicle 200 so that the charging apparatus 100 provides the second PWM signal C2 to the second terminal 100B. In this condition, the control unit 2 calculates the second time when the current I reaches to the nearest zero point from the present current, and calculates the third time through based on the second time and the preset first time. Therefore, the control signal Sc is provided to control the switch unit 1 at the third time so that the switch unit 1 can be turned on just before the zero point (i.e., at time tx). In one embodiment, during time t3 to time t4 is a specified time for turning on (the connection of) the switch unit 1. The turning on (the connection of) the switch unit 1 must be completed within 3 seconds of the electric vehicle specification, for example, but not limited to IEC 61851-1. After the charging apparatus 100 calculates the third time, the switch unit 1 can be controlled to be turned on/connected within the specified time.

After the electric vehicle 200 confirms that the charging is completed (i.e., at time t5), the electric vehicle 200 adjusts the second PWM signal C2 to the first PWM signal B2 to notify the charging apparatus 100 that the charging is completed. In this condition, the control unit 2 also calculates the third time so as to provide the control signal Sc to control the switch unit 1 at the third time so that the switch unit 1 can be turned off when it is close to the zero point (i.e., at time ty). Similarly, during time t5 to time t6 is a specified time for turning off (the disconnection of) the switch unit 1. Afterward, after the electric vehicle 200 is physically disconnected from the charging apparatus 100 (i.e., at time t7), the charging apparatus 100 confirms the disconnection of the electric vehicle 200 and provides the PWM signal A2 to the second terminal 100B (i.e., during time t7 to time t8). After confirming that the electric vehicle 200 is pulled away (disconnected), the charging apparatus 100 returns to the standby state and provides the communication signal Scom with the first positive voltage level A1 (i.e., at time t8).

In FIG. 4B, the electric vehicle 200 is just pulled away without notifying the charging device 100 that the charging has been completed (i.e., being pulled away before being fully charged). The difference between FIG. 4B and FIG. 4A is that there is no stage from time t5 to time t7 in FIG. 4B. After the charging apparatus 100 detects that the electric vehicle 200 is physically disconnected at time t7, the charging apparatus 100 starts to confirm the disconnection of the electric vehicle 200 and provides the PWM signal A2 to the second terminal 100B. Also, the control signal Sc is provided at the third time to control the switch unit 1 so that the switch unit 1 can be turned off just when it is close to the zero point (i.e., at time ty). Similarly, during time t7 to time t8 is a specified time for turning off (the disconnection op the switch unit 1. After time t8, the charging apparatus 100 confirms that the electric vehicle 200 is pulled away and provides the PWM signal A2 to the second terminal 100B.

Figure 5A:
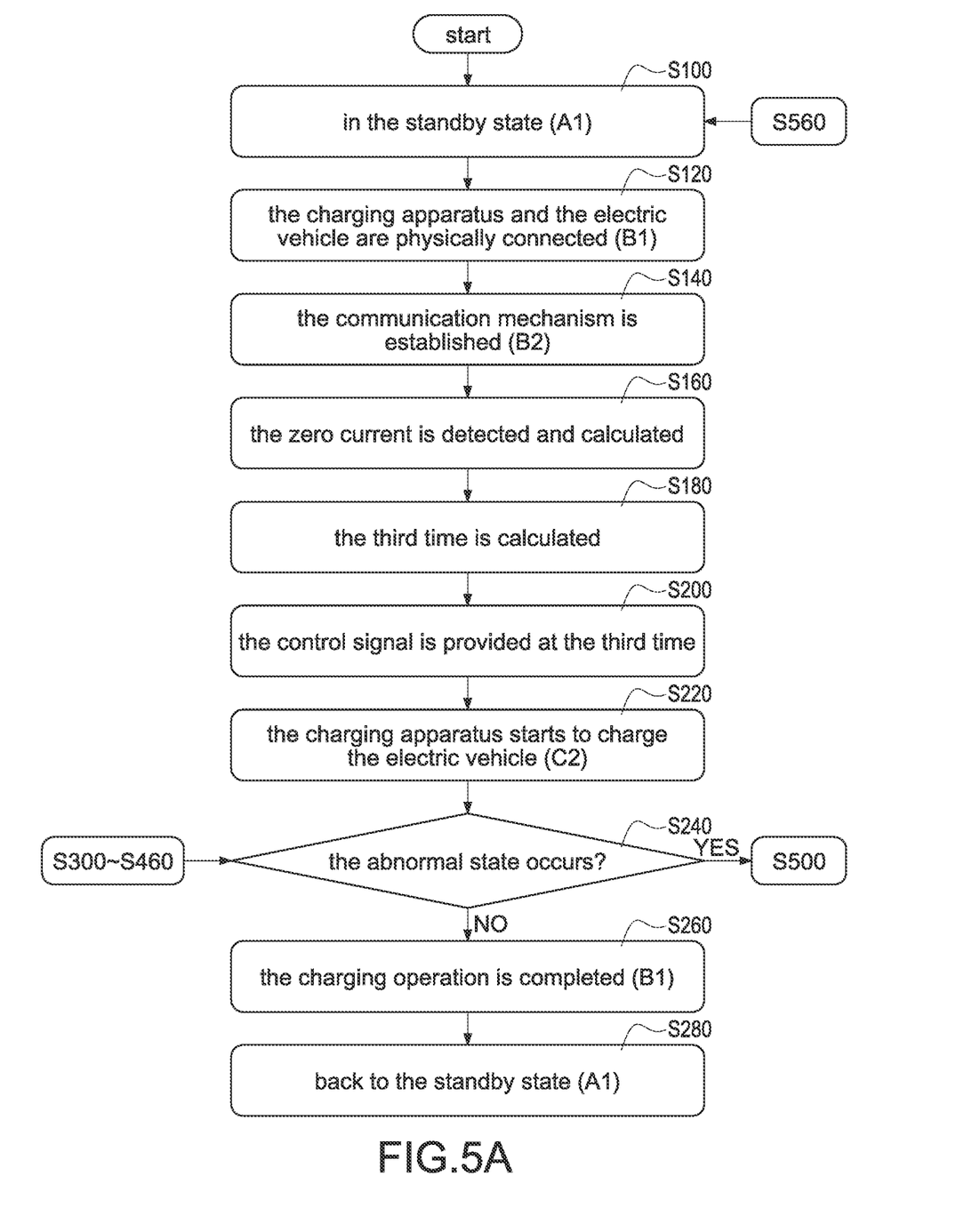
FIG. 5A is a flowchart of a method of operating the charging apparatus under a normal state according to the present disclosure.
Figure 5B:
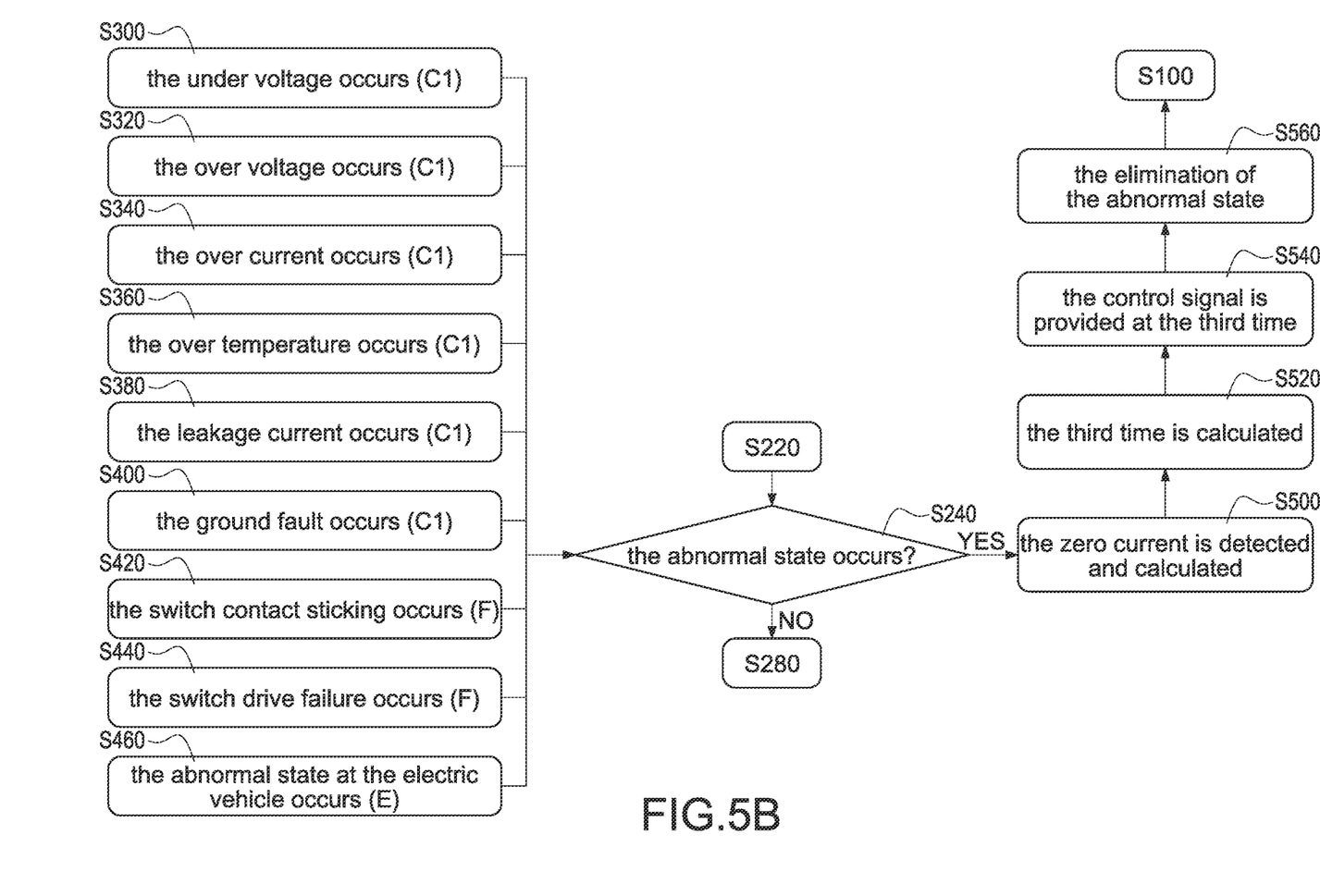
FIG. 5B is a flowchart of the method of operating the charging apparatus under an abnormal state according to the present disclosure.

Please refer to FIG. 5A, which shows a flowchart of a method of operating the charging apparatus under a normal state according to the present disclosure, and please refer to FIG. 5B, which shows a flowchart of the method of operating the charging apparatus under an abnormal state according to the present disclosure, and also refer to FIG. 2 to FIG. 4B. Steps S100 to S280 described in FIG. 5A may be referred to in conjunction with FIG. 4A, and the detail description is omitted here for conciseness. Steps S300 to S460 described in FIG. 5B are respectively the aspects of each abnormal state. When each abnormal state occurs, the communication signal Scom is adjusted to be a signal corresponding to each abnormal state. Therefore, in step S240, when it is confirmed that the abnormal state of any one of the above steps S300 to S460 occurs, the control unit 2 of the charging apparatus 100 calculates the second time for the current I to reach to the nearest zero point from the present current (S500), and the third time is calculated according to the second time and the preset first time (S520) so as to provide the control signal Sc at the third time to control the switch unit 1 (S540) so that the switch unit 1 can be turned off just when it is close to the zero point. After the control unit 2 controls the switch unit 1 to be turned off, the abnormality is eliminated (S560) and then return to step S100.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A charging apparatus, configured to charge an electric vehicle, the charging apparatus comprising:
    a first terminal, configured to receive a power source,
    a second terminal, coupled to the electric vehicle,
    a switch unit, coupled to the first terminal and the second terminal, and configured to be turned on or turned off to control whether the first terminal is coupled to the second terminal,
    a control unit, coupled to the switch unit, and configured to set a first time from the switch unit receiving a control signal to the switch unit actually being turned on or turned off, and
    a communication unit, coupled to the control unit and the second terminal, and the control unit and the electric vehicle mutually transmitting a communication signal through the communication unit,
    wherein the control unit detects a phase of a current of the power source, indicates an abnormal state based on the communication signal, and calculates a second time when the current reaches to a zero point based on the phase; the control unit calculates a third time when the switch unit operates at the zero point based on the first time and the second time, and provides the control signal to turn off the switch unit at the third time.

2. The charging apparatus as claimed in claim 1, wherein the control unit calculates the second time according to the phase based on that the electric vehicle is coupled to the second terminal and the communication signal indicates a normal state; the control unit calculates the third time based on the first time and the second time so as to provide the control signal to turn on the switch unit at the third time.

3. The charging apparatus as claimed in claim 1, wherein the control unit calculates the second time according to the phase based on that the communication signal indicates a charging completion; the control unit calculates the third time based on the first time and the second time so as to provide the control signal to turn off the switch unit at the third time.

4. The charging apparatus as claimed in claim 1, wherein the control unit comprises:
    a controller, coupled to the switch unit and the communication unit, and configured to set the first time, and
    a detection unit, coupled to the controller, and the controller detects whether the abnormal state of the charging apparatus occurs through the detection unit,
    wherein the controller provides the control signal to control the switch unit at the third time based on the communication signal.

5. The charging apparatus as claimed in claim 4, wherein the detection unit comprises:
    a first voltage detection unit, coupled between the first terminal and the switch unit, and configured to detect a voltage of the power source and provide a first voltage signal,
    a current detection unit, coupled between the first terminal and the switch unit, and configured to detect the current and provide a current signal, and
    a temperature detection unit, configured to detect a temperature of the charging apparatus and provide a temperature signal,
    wherein the controller determines whether the abnormal state of an under voltage or an over voltage occurs based on the first voltage signal, whether the abnormal state of an over current occurs based on the current signal, and whether the abnormal state of an over temperature occurs based on the temperature signal; the controller provides the communication signal with a positive voltage level through the communication unit based on the abnormal state of any one of the under voltage, the over voltage, the over current, and the over temperature.

6. The charging apparatus as claimed in claim 5, wherein the detection unit comprises:
    a second voltage detection unit, coupled between the switch unit and the second terminal, and configured to detect the voltage and provide a second voltage signal,
    wherein the controller determines whether an abnormality of switch contact sticking or switch driving failure occurs at the switch unit based on the first voltage signal and the second voltage signal, and provides the communication signal with a negative voltage level through the communication unit based on any one of the abnormalities of switch contact sticking or switch driving failure.

7. The charging apparatus as claimed in claim 4, wherein the detection unit comprises:
    a leakage current detection unit, coupled between the first terminal and the switch unit, and configured to detect the current and provide a leakage current signal, and
    a ground detection unit, coupled to a ground end of the charging apparatus, and configured to provide a detection signal by detecting the ground end,
    wherein the controller determines whether the abnormal state of a leakage current occurs based on the leakage current signal, and whether the abnormal state of a ground fault occurs based on the detection signal; the controller provides the communication signal with a positive voltage level through the communication unit based on the abnormal state of any one of the leakage current and the ground fault.

8. The charging apparatus as claimed in claim 1, wherein the control unit realizes that the abnormal state occurs at the electric vehicle based on the communication signal being a zero voltage level.

9. A method of operating a charging apparatus, the charging apparatus configured to provide a power source to charge an electric vehicle, and the charging apparatus comprising a switch unit and a communication unit; the switch unit being turned on or turned off to control whether the power source is coupled to the electric vehicle, the method comprising steps of:
    setting a first time from when the switch unit receiving a control signal to when the switch unit actually being turned on or turned off, and detecting a phase of a current of the power source, mutually transmitting a communication signal with the electric vehicle through the communication unit, and confirming whether the communication signal indicates an abnormal state, calculating a second time when the current reaches to a zero point through the phase based on the abnormal state, and calculating a third time when the switch unit operates at the zero point based on the first time and the second time, and providing the control signal to turn off the switch unit at the third time.

10. The method as claimed in claim 9, further comprising steps of:

calculating the second time based on the physical coupling of the electric vehicle and a normal-state indication of the communication signal, and calculating the third time based on the first time and the second time so as to provide the control signal to turn on the switch unit at the third time.

11. The method as claimed in claim 10, further comprising steps of:

setting the communication signal to a first positive voltage level based on a standby state, confirming that the electric vehicle is physically coupled, setting the communication signal to a second positive voltage level, and providing the second positive voltage level to the electric vehicle, establishing a communication relationship between the electric vehicle and the communication unit, and adjusting the second positive voltage level to a first PWM signal corresponding to the second positive voltage level, and waiting to receive the power source for the electric vehicle, and adjusting the first PWM signal to a second PWM signal corresponding to a third positive voltage level to indicate a normal state.

12. The method as claimed in claim 11, further comprising steps of:

setting the second PWM signal to the first PWM signal based on the communication signal to indicate a charging completion, and calculating the second time through the phase, calculating the third time based on the first time and the second time so as to provide the control signal to turn off the switch unit at the third time, and setting the communication signal to a first positive voltage level to return to the standby state.

13. The method as claimed in claim 9, further comprising steps of:

detecting a voltage provided by the power source to a path to where the switch unit is coupled and providing a first voltage signal, detecting the current and providing a current signal, detecting a temperature of the charging apparatus and providing a temperature signal, determining whether an abnormal state of an under voltage or an over voltage occurs based on the first voltage signal, determining whether the abnormal state of an over current occurs based on the current signal, and determining whether the abnormal state of an over temperature occurs based on the temperature signal, and setting the communication signal to a third positive voltage level based on any one of the abnormal states of the under voltage, the over voltage, the over current, and the over temperature.

14. The method as claimed in claim 13, further comprising steps of:

detecting a voltage on a path between the switch unit and the electric vehicle and providing a second voltage signal, determining whether an abnormality of switch contact sticking or switch driving failure of the switch unit occurs based on the first voltage signal and the second voltage signal, and setting the communication signal to a first negative voltage level based on the abnormality of switch contact sticking or switch driving failure.

15. The method as claimed in claim 9, further comprising steps of:

detecting the current and providing a leakage current signal, detecting a ground end of the charging apparatus and providing a detection signal, determining whether the abnormal state of a leakage current occurs based on the leakage current signal, and determining whether the abnormal state of a ground fault occurs based on the detection signal, and setting the communication signal to a third positive voltage level based on any one of the abnormal states of the leakage current and the ground fault.

16. The method as claimed in claim 9, further comprising a step of:

realizing that the abnormal state of the electric vehicle occurs based on the communication signal being setting to a zero voltage level.

\* \* \* \* \*